(12) United States Patent
Dong et al.

(10) Patent No.: US 6,776,330 B2
(45) Date of Patent: Aug. 17, 2004

(54) HYDROGEN FLUXLESS SOLDERING BY ELECTRON ATTACHMENT

(75) Inventors: Chun Christine Dong, Macungie, PA (US); Wayne Thomas McDermott, Fogelsville, PA (US); Richard E. Patrick, Tamaqua, PA (US); Brenda F. Ross, Whitehall, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 77 days.

(21) Appl. No.: 09/949,580

(22) Filed: Sep. 10, 2001

(65) Prior Publication Data

US 2003/0047591 A1 Mar. 13, 2003

(51) Int. Cl.$^7$ .............................................. B23K 35/38
(52) U.S. Cl. ..................... 228/220; 219/129; 219/85.22
(58) Field of Search ................................ 228/219, 220; 219/129, 85.22, 85.1

(56) References Cited

U.S. PATENT DOCUMENTS

| | | | |
|---|---|---|---|
| 3,742,213 A | 6/1973 | Cohen et al. .......... 250/41.9 TF |
| 5,105,761 A | 4/1992 | Charlet et al. ............... 118/723 |
| 5,223,691 A | * 6/1993 | Frei et al. ............... 219/121.46 |
| 5,345,056 A | * 9/1994 | Frei et al. ............... 219/121.59 |
| 5,409,543 A | 4/1995 | Panitz et al. ..................... 134/2 |
| 5,433,820 A | 7/1995 | Sindzingre et al. ........... 216/13 |
| 5,722,581 A | 3/1998 | Sindzingre et al. ......... 228/206 |
| 5,807,614 A | 9/1998 | Sindzingre et al. ......... 427/540 |
| 5,807,615 A | 9/1998 | Sindzingre et al. ......... 427/562 |
| 5,858,312 A | 1/1999 | Sindzingre et al. .... 422/186.04 |
| 5,928,527 A | 7/1999 | Li et al. ........................ 216/67 |
| 5,941,448 A | 8/1999 | Sindzingre et al. ......... 228/206 |
| 5,985,378 A | 11/1999 | Paquet ......................... 427/562 |
| 6,004,631 A | 12/1999 | Mori ............................ 427/534 |
| 6,007,637 A | 12/1999 | Sindzingre et al. ............. 134/2 |
| 6,021,940 A | 2/2000 | Sindzingre et al. ......... 228/203 |
| 6,037,241 A | 3/2000 | Powell et al. ................ 438/479 |
| 6,089,445 A | 7/2000 | Sindzingre et al. ......... 228/218 |
| 6,158,648 A | * 12/2000 | Mori et al. .................. 228/206 |
| 6,174,500 B1 | 1/2001 | Uno et al. ............. 422/186.14 |
| 6,193,135 B1 | 2/2001 | Fang et al. .................. 228/105 |
| 6,194,036 B1 | 2/2001 | Babayan et al. ............. 427/563 |
| 6,196,446 B1 | 3/2001 | Fang et al. .................. 228/219 |
| 6,203,637 B1 | 3/2001 | Dommann et al. ........ 156/73.1 |

FOREIGN PATENT DOCUMENTS

DE      196 54 250 A1      3/1998

OTHER PUBLICATIONS

"Fluxless Soldering Under Activated Atmosphere at Ambient Pressure", Potter, et al.
"Fluxless Flip Chip Solder Joining," Koopman, et al.
"Flux–Free Soldering," Shiloh, et al.
Swanson, D.: "Fluxless Soldering Under Ambient Pressure Plasma Cleaning"; Electronic Packaging and Production, Oct. 1995, p. 32, vol. 35, No. 11.
Search Report No. 0201977.4–1262 dated Jan. 8, 2003.

* cited by examiner

Primary Examiner—M. Alexandra Elve
Assistant Examiner—Len Tran
(74) Attorney, Agent, or Firm—Geoffrey L. Chase (57) ABSTRACT

A method of dry fluxing metal surfaces of one or more components to be soldered, comprising the steps of: a) providing one or more components to be soldered which are connected to a first electrode as a target assembly; b) providing a second electrode adjacent the target assembly; c) providing a gas mixture comprising a reducing gas between the first and second electrodes; d) providing a direct current (DC) voltage to the first and second electrodes and donating electrons to the reducing gas to form negatively charged ionic reducing gas; e) contacting the target assembly with the negatively charged ionic reducing gas and reducing oxides on the target assembly.

24 Claims, 4 Drawing Sheets

HYDROGEN FLUXLESS SOLDERING BY ELECTRON ATTACHMENT

BACKGROUND OF THE INVENTION

Reflow soldering is the most widely used technique in the assembly of surface-mount electronic components. In the reflow soldering process, components are mounted on the corresponding trace area of a circuit board with a solder paste previously printed on the circuit board. Such formed soldering parts are then loaded into a reflow furnace, passing through heating and cooling zones and solder joints between component leads and solder lands on the circuit board are formed by melting, wetting, and solidifying the solder paste. To ensure a good wetting of the molten solder on the joining surfaces, organic fluxes are normally contained in the solder pastes to remove initial surface oxides on both solder and base metal and to keep the surfaces in a clean state before solidification. The fluxes are mostly evaporated into vapor phase during soldering, however, the flux volatiles may cause problems, such as forming voids in the solder joints and contaminating the reflow furnace. After soldering, there are always some flux residues left on the circuit board that may cause corrosion and electric shorts.

Wave soldering, on the other hand, is a traditionally used soldering method for assembling insertion-mount components. It also can be used for surface-mount components by temporarily bonding the components on the circuit board by an adhesive before soldering. For both cases, the circuit boards with components inserted or temporarily bonded have to be cleaned by using a liquid flux to remove oxides on the component leads and solder lands, and then pass through a high temperature molten solder bath. The molten solder automatically wets the metal surfaces to be soldered and solder joints are thus formed. The molten solder in the bath has a high tendency to be oxidized, forming solder dross. Therefore the surface of the solder bath has to be frequently cleaned by mechanically removing the dross, which increases the operation cost and the consumption of the solder. After soldering, flux residues remain on the circuit boards, which brings the same problems as described for reflow soldering.

To remove the flux residues, a post-cleaning process has to be used. Chlorofluorocarbons (CFCs) were normally used as the cleaning agents, but they are believed to be damaging the earth's protective ozone layer and their use was banned. Although no-clean fluxes have been developed by using a small amount of activators to reduce residues, there is a trade off between the gain and loss in the amount of flux residues and the activity of the fluxes.

A good solution to all the problems described above, including flux volatiles, flux residues, and dross formation, is using a reducing gas as a soldering environment to replace organic fluxes for removing metal oxides. Such soldering technique is called "fluxless soldering". Among various fluxless soldering methods, the use of hydrogen as a reactive gas to reduce oxides on base metals and solders is especially attractive because it is a very clean process (the only by-product is water which can be easily ventilated out of the furnace), and it can be compatible with an open and continued soldering production line ($H_2$ is non-toxic and has a flammable range of 4 to 75%). Therefore, hydrogen fluxless soldering has been a technical goal for a long time.

However, the major limitation of hydrogen fluxless soldering is the inefficient and slow reduction rate of metal oxides in hydrogen at the normal soldering temperature range, especially for solder oxides, which have higher metal-oxygen bond strengths than that of the oxides on the base metals to be soldered. This inefficiency of hydrogen is attributed to the lack of reactivity of the hydrogen molecule at low temperatures. Highly reactive radicals, such as monoatomic hydrogen, form at temperatures much higher than the normal soldering temperature range. For example, the effective temperature range for pure $H_2$ to reduce tin oxides on a tin-based solder is above 350° C. Such high temperatures may either damage integrated circuit (IC) chips or cause reliability problems. Therefore, a catalytic method to assist generating highly reactive $H_2$ radicals in the normal soldering temperature range has been sought by the industry.

Fluxless (dry) soldering has been performed in the prior art using several techniques:

Chemically active halogen-containing gases, such as $CF_4Cl_2$, $CF_4$ and $SF_6$ can be used to remove surface oxides for soldering. However, such gases leave halide residues, which reduce solder bond strength and promote corrosion. Such compounds also present safety and environmental disposal problems, and can chemically attack soldering equipment.

Metal oxides can be ablated, or heated to their vaporization temperatures using lasers. Such processes are typically performed under inert or reducing atmospheres to prevent re-oxidation by the released contaminants. However, the melting or boiling points of the oxide and base metal can be similar, and it is not desirable to melt or vaporize the base metal. Therefore, such laser processes are difficult to implement. Lasers are also typically expensive and inefficient to operate, and must have a direct line of sight to the oxide layer. These factors limit the usefulness of laser techniques for most soldering applications.

Surface oxides can be chemically reduced (e.g., to $H_2O$) through exposure to reactive gases (e.g., $H_2$) at elevated temperatures. A mixture containing 5% or greater reducing gas in an inert carrier (e.g., $N_2$) is typically used. The reaction products (e.g., $H_2O$) are then released from the surface by desorption at the elevated temperature, and carried away in the gas flow field. Typical process temperatures must exceed 350° C. However, this process can be slow and ineffective, even at elevated temperatures.

The speed and effectiveness of the reduction process can be increased using more active reducing species. Such active species can be produced using conventional plasma techniques.

Gas plasmas at audio, radio, or microwave frequencies can be used to produce reactive radicals for surface de-oxidation. In such processes, high intensity electromagnetic radiation is used to ionize and dissociate $H_2$, $O_2$, $SF_6$, or other species, including fluorine-containing compounds, into highly reactive radicals. Surface treatment can be performed at temperatures below 300° C. However, in order to obtain optimum conditions for plasma formation, such processes are typically performed under vacuum conditions. Vacuum operations require expensive equipment and must be performed as a slow, batch process, rather than a faster, continuous process. Also, plasmas are typically dispersed diffusely within the process chamber, and are difficult to direct at a specific substrate area. Therefore, the reactive species cannot be efficiently utilized in the process. Plasmas can also cause damage to process chambers through a sputtering process, and can produce an accumulation of space charge on dielectric surfaces, leading to possible micro-circuit damage. Microwaves themselves can also cause micro-circuit damage, and substrate temperature may be difficult to control during treatment. Plasmas can also release potentially dangerous ultraviolet light. Such processes also require expensive electrical equipment and consume considerable power, thereby reducing their overall cost effectiveness.

U.S. Pat. No. 5,409,543 discloses a process for producing a reactive hydrogen species using thermionic (hot filament) emission of electrons. The energized hydrogen chemically reduces the substrate surface. The thermionic electrons are emitted from refractory metal filaments held at temperatures from 500° C. to 2200° C. Electrically biased grids are used to deflect or capture excess free electrons. The reactive species are produced from mixtures containing 2% to 100% hydrogen in an inert carrier gas.

U.S. Pat. No. 6,203,637 also disclosed a process for activating hydrogen using the discharge from a thermionic cathode. In this case the emission process is performed in a separate (remote) chamber containing a heated filament. Ions and activated neutrals flow into the treatment chamber to chemically reduce the oxidized metal surface. However, such hot cathode processes require vacuum conditions for optimum effectiveness and filament life. Vacuum operations require expensive equipment, which must be incorporated into soldering conveyor belt systems, thereby reducing their overall cost effectiveness.

Potier, et al., "Fluxless Soldering Under Activated Atmosphere at Ambient Pressure", Surface Mount International Conference, 1995, San Jose, Calif., and U.S. Pat. Nos. 6,146,503, U.S. 6,089,445, U.S. 6,021,940, U.S. 6,007,637, U.S. 5,941,448, U.S. 5,858,312 and U.S. 5,722,581 describe a process for producing activated $H_2$ (or other reducing gases, such as $CH_4$ or $NH_3$) using electrical discharge. The reducing gas is present at "percent levels" in an inert carrier gas ($N_2$). The discharge is produced using an alternating voltage source of "several kilovolts". Electrons emitted from electrodes in a remote chamber produce charged and neutral hydrogen radicals, which are then flowed to the substrate. The resulting process reduces oxides on the base metal to be soldered at temperatures near 150° C. However, such remote discharge chambers require significant equipment costs, and are not easily retrofitted to existing soldering conveyor belt systems. In addition, the process is not designed for removing solder oxides.

U.S. Pat. No. 5,433,820 describes a surface treatment process using electrical discharge or plasma at atmospheric pressure from a high voltage (1 kV to 50 kV) electrode. The electrode is placed in the proximity of the substrate rather than in a remote chamber. The free electrons emitted from the electrodes produce reactive hydrogen radicals, a plasma containing atomic hydrogen, which then pass through openings in a dielectric shield placed over the oxidized substrate. The dielectric shield concentrates the active hydrogen onto those specific surface locations requiring deoxidation. However, such dielectric shields can accumulate surface charge that may alter the electric field and inhibit precise process control. The described process is only used to flux base metal surfaces.

Additional prior art of interest include: U.S. Pat. Nos. 3,742,213; U.S. 5,105,761; U.S. 5,807,614; U.S. 5,807,615; U.S. 5,928,527; U.S. 5,985,378; U.S. 6,004,631; U.S. 6,037, 241; U.S. 6,174,500; U.S. 6,193,135; U.S. 6,194,036; U.S. 6,196,446; Koopman, et. al., Fluxless Flip Chip Solder Joining, NEPCON WEST '95 PROCEEDINGS, pp 919–931; and Shiloh, et. al., Flux-free Soldering, NEPCON WEST '94 PROCEEDINGS, pp 251–273.

The shortcomings of the prior art in providing an economical and efficient fluxless soldering process to remove base metal and solder oxides for superior soldering without oxide or flux flaws in the solder joint are overcome by the present invention, which provides fluxless soldering at low temperatures, near ambient or atmospheric conditions and with low DC power requirements or similar low energy electron propagation to use negatively charged ionic hydrogen to actively react with oxides before or during the soldering operation, as set forth in greater detail below.

BRIEF SUMMARY OF THE INVENTION

The present invention is a method of dry fluxing metal surfaces of one or more components to be soldered, comprising the steps of: a) providing one or more components to be soldered which are connected to a first electrode as a target assembly; b) providing a second electrode adjacent the target assembly; c) providing a gas mixture comprising a reducing gas between the first and second electrodes; d) providing a direct current (DC) voltage to the first and second electrodes and donating electrons to the reducing gas to form negatively charged ionic reducing gas; e) contacting the target assembly with the negatively charged ionic reducing gas and reducing oxides on the target assembly.

Preferably, the reducing gas is hydrogen in an inert gas such as nitrogen to comprise the gas mixture. The components are preferably printed circuit boards or electronic devices, more preferably electronic devices mounted on a printed circuit board. Preferably, as or after the dry fluxing to remove oxides the components are soldered by reflow or wave soldering at elevated temperature.

DETAILED DESCRIPTION OF THE INVENTION

The present invention concerns $H_2$ fluxless soldering. The present invention can be made by modifying the traditional reflow or wave soldering machine. The present invention is also applicable to metal plating, such as the solder plating of portions of printed circuit boards or metal surfaces to make them more amenable to subsequent soldering. The removal of oxides by hydrogen fluxless processing of the present invention is equally applicable to such metal plating techniques.

Figure 1:
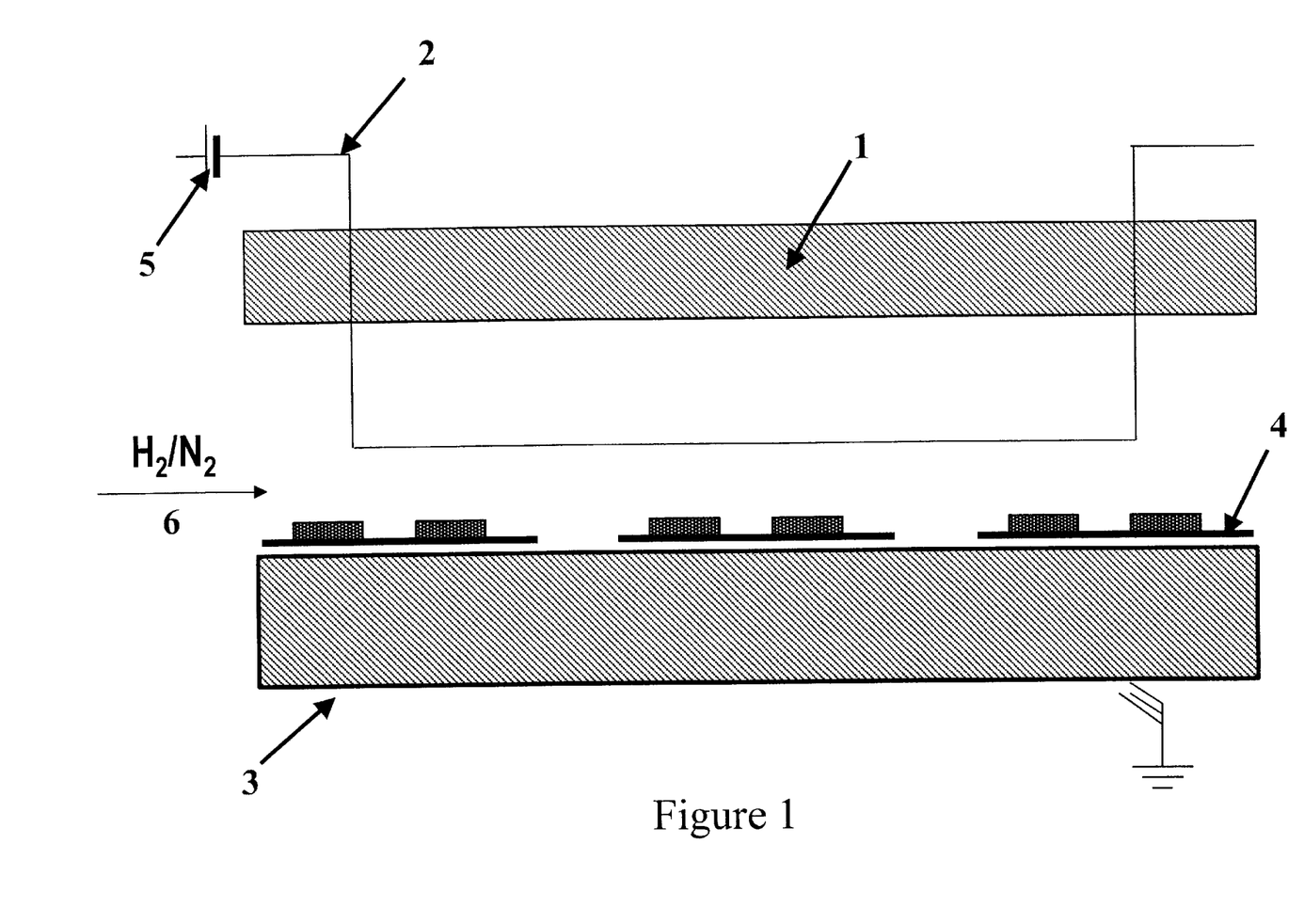
FIG. 1 is a schematic illustration of a first embodiment of the present invention for reflow soldering.
Figure 2:
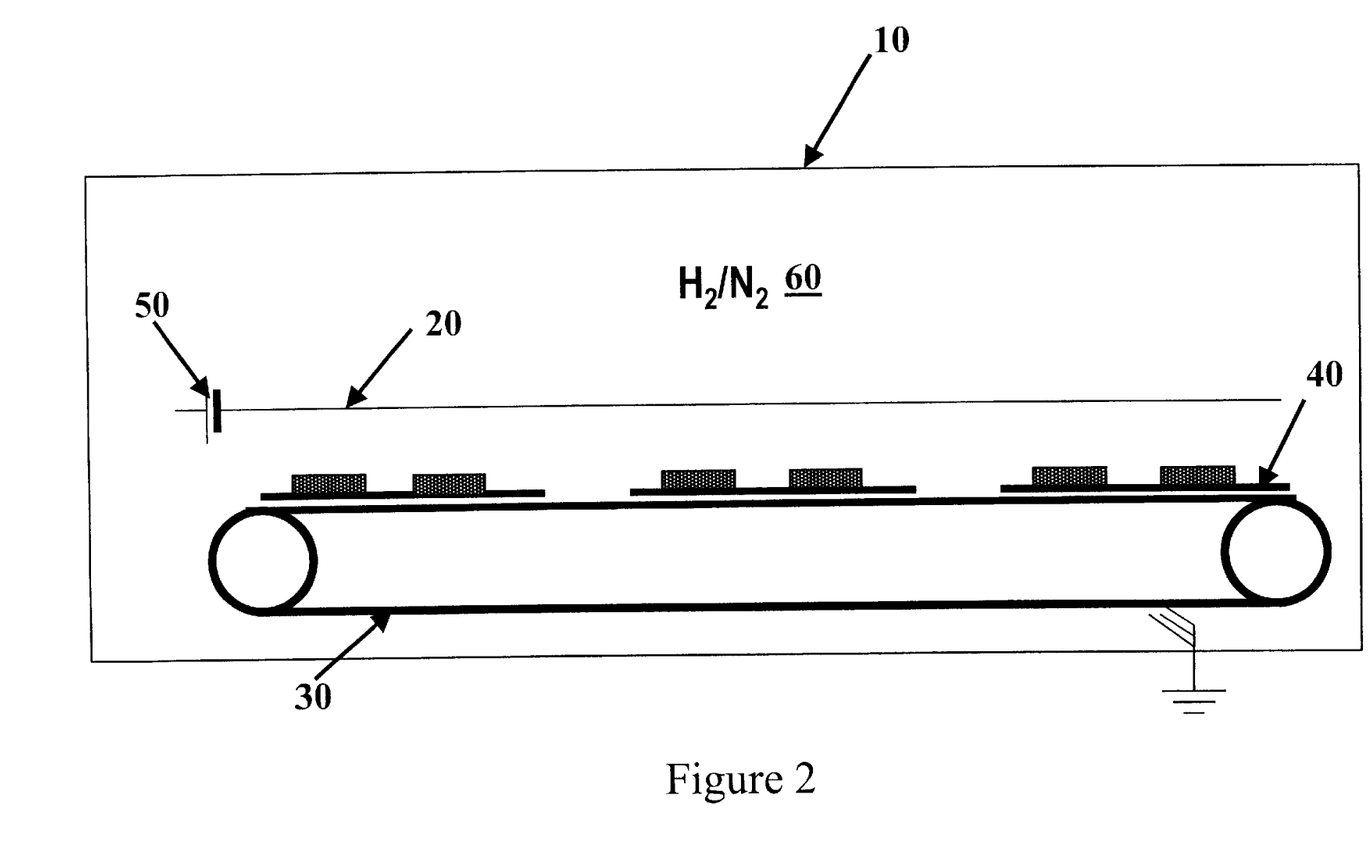
FIG. 2 is a schematic illustration of a second embodiment of the present invention for "fluxing" prior to wave soldering.
Figure 3:
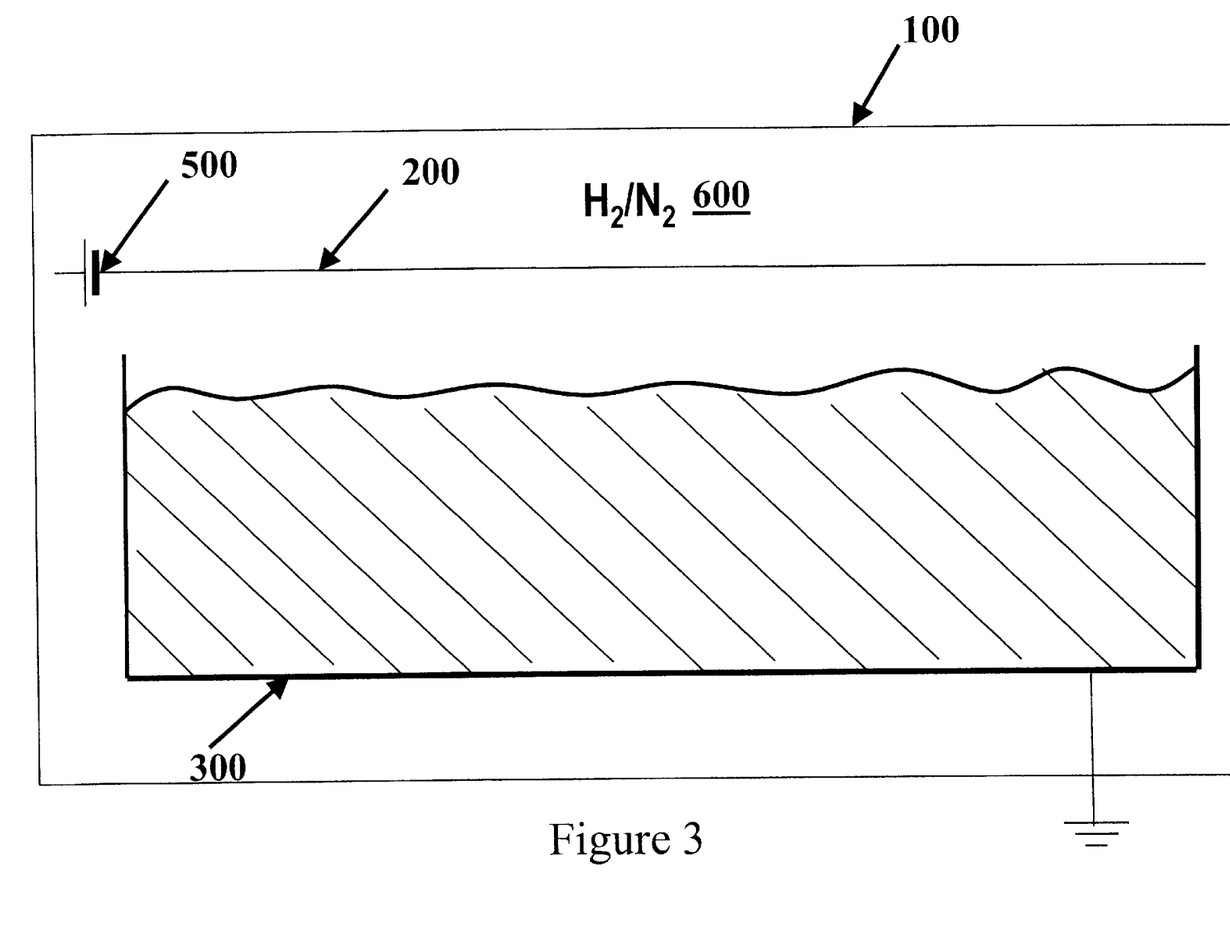
FIG. 3 is a schematic illustration of a third embodiment of the present invention for treating a wave solder bath.

The principal of the method can be shown in FIG. 1, 2 or 3. During soldering or fluxing, a gas mixture of nitrogen and a reducing gas, such as hydrogen or carbon monoxide, is introduced into a heating chamber, oven or a furnace with a cathode and anode and the parts to be soldered or fluxed are connected to or mounted on the anode to form a target assembly. When a DC voltage is applied between the cathode and the anode, low-energy electrons are generated at the cathode and drift to the anode in the electric field. During this electron drift, a part of the molecular reducing gas, i.e., $H_2$, can form negative ions by electron attachment and then drift to the anode also. At the anode, the negatively charged ionic hydrogen can attach on the solder and metal surfaces to be soldered and thus reduce the respective oxides without the use of traditional fluxes. During this process, the inert gas, i.e., $N_2$, is not affected because the electron affinity of nitrogen is zero.

For the present invention, the $H_2$ concentration in the gas mixture may be comprised between approximately 0.1 to 100% by volume, and more preferably between approximately 0.5 to 50% by volume. The temperature may range between approximately ambient to 400° C., and more favorably between approximately 100 to 250° C. The DC voltage may comprise between approximately −1 to −50 kV, and the preferred range is between approximately −2 to −30 kV. The distance between the cathode and the top surface of the parts to be treated may be approximately 1 to 10 cm, and the preferred range is approximately 2 to 5 cm. The cathode or device from which the electrons are generated (photoemissive or radioactive source) should be close to the anode or target assembly and does not require a separate chamber or zone. Besides $H_2$, other reducing gases may also be used in the gas mixture, such as CO. The inert gas used in the gas mixture other than $N_2$ can be Ar, He, and others. The pressure is preferably ambient atmospheric pressure, meaning the existing pressure of the area of the process. No special pressure, such as vacuum, is required. Typically, pressures of 10 to 20 psia would be acceptable, but a pressure of 14 to 16 psia, preferably 14.7 psia, is most appropriate.

In addition to the electron attachment technique described above, electron attachment to hydrogen molecules or diatomic hydrogen can be accomplished by photoemission from a photosensitive cathode, electron beam techniques, radioactive source techniques, and avalanche techniques where cascading initial electrons drift to successively higher potential electrodes in an electrode array causing additional electrons from each succeeding electrode. Photoemission of free low energy electrons may occur following, for example, exposure of a photosensitive source to ultraviolet or other suitable wavelength light. In those techniques where the electrons are not emitted due to a DC voltage (i.e., photoemission) the cathode and anode would still be biased to draw the generated electrons and ultimately the negatively charged ionic hydrogen molecule or diatomic hydrogen to the anode.

Although not wanting to be held to any particular theory on the mechanism of the present invention, the inventors believe that when a direct current voltage is applied to the electrodes, low energy electrons are generated at the cathode and drift toward the anode in the electric field. Low energy electrons have enough energy to leave the cathode and attach to molecular or diatomic hydrogen, but insufficient energy to dissociate the hydrogen molecule. During the electron drift, a part of the molecular reducing gas, such as hydrogen, can form negative ions by electron attachment and then drift to the anode also. At the anode, the negatively charged ionic hydrogen can attach on the solder and the base metal surfaces to be soldered and thus reduce the existing oxides of solder and base metal. The activation energy of oxide reduction using the electron attachment process of the present invention is lower than without the attachment because bombardment with attached electrons eliminates most of the energy required with the bond breaking of the oxides. The entire process can be illustrated as follows:

Electron Attachment: 
(between cathode and anode)
Oxide Reduction:  (M=solder/base metal)
(adjacent anode)

FIG. 1 shows an example of the modified reflow-soldering machine in a schematic cross section. The apparatus comprises an oven or furnace 1 which typically have heating/cooling zones located at different sections along the center axis and with gas inlet/outlet at the two ends of the oven/furnace 1. A metal rod 2 (or wire mesh 2d) stretched in the oven/furnace 1 is used for a cathode or second electrode, which is made of a metal with low electron-emission energy, such as brass or stainless steel. A grounded moving belt 3 made of a conductive material, such as a metal, is used as an anode or first electrode. During reflow soldering, the one or more components 4, such as electronic devices on a printed circuit board, temporarily connected together by solder paste previously printed on one or more of the components, are positioned on the moving belt 3, all of which form a target assembly passing through the oven/furnace 1 and the heating and cooling zones. A gas mixture 6 of nitrogen and a reducing gas, such as hydrogen or carbon monoxide, is introduced into the oven/furnace 1, and a DC voltage 5 is applied between the rod/cathode 2 and the belt/anode 3. The gas mixture responds to the charge between the cathode and the anode by electrons being donated at the site of the cathode to the reducing gas, preferably hydrogen, to become a negatively charged ionic reducing gas, which characteristically migrates to the anode, including the solder and components, which thereby have any existing oxides reduced in a dry fluxless basis to significantly enhance solder joining. The solder paste is melted in a heated zone of the oven/furnace 1, wets the surface of the components and resolidifies in the cool zone of the oven/furnace 1 to form the soldered product, which requires no flux and avoids solder imperfections caused by oxides or flux residues.

FIG. 2 is another example used for a fluxing section prior to wave soldering, which is quite similar to FIG. 1. The apparatus comprises a heating chamber 10, a cathode made of a metal rod 20 or wire mesh, and a grounded- and conductive-moving belt 30 serving as an anode. During fluxing, circuit boards with components temporarily inserted into the circuit board 40 are mounted on the belt 30 passing through the chamber 10, a gas mixture of nitrogen and hydrogen 60 is introduced into the chamber 10, and a DC voltage 50 is applied between the cathode 20 and the grounded belt anode 30. The components have their contacts soldered to the circuit board as they pass against a standing wave of solder in a solder bath, while both the components/circuit boards and the solder bath are free of oxides by the action of the negatively charged ionic hydrogen reducing gas.

FIG. 3 is a third example used for fluxing the molten solder bath in a wave-soldering process, which is also quite similar to FIG. 1. The apparatus comprises a chamber 100, a cathode made of a metal rod 200 or wire mesh, and a grounded high-temperature solder bath 300 serving as an anode. During operation, a gas mixture of nitrogen and hydrogen 600 is introduced into the chamber 100, and a DC voltage 500 is applied between the cathode 200 and the wall of the grounded solder bath anode 300. This preserves the surface of the solder bath anode 300 free of solder oxides or dross by the action of the negatively charged ionic hydrogen reducing gas.

Figure 4:
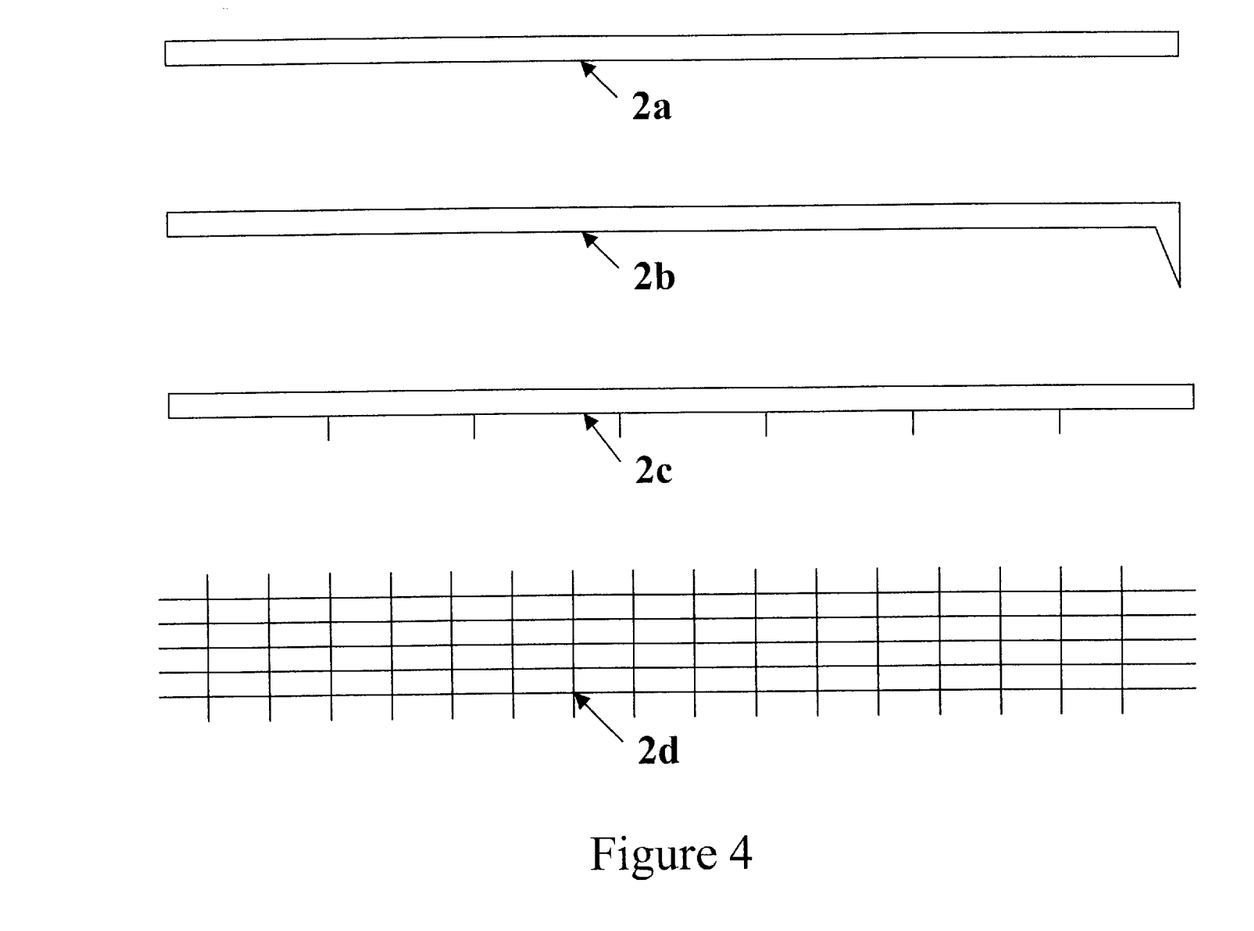
FIG. 4 is a schematic illustration of different cathode designs for the present invention.

For the above cases, the geometry of the cathode can be designed into different shapes, such as examples shown in FIG. 4, a rod 2a, a rod with one sharpened tip 2b, a rod with several sharpened tips 2c and a screen or wire mesh 2d. The material of the cathode can be brass, stainless steel, or other metals with relatively low electron-emission energy.

EXAMPLE 1

A first experiment was conducted by using a lab-scale furnace. The sample used was a fluxless tin-lead solder preform (m.p. 183° C.) on a grounded copper plate (anode), which was loaded inside a furnace and heated up to 250° C. under a gas flow of 5% $H_2$ in $N_2$. When the sample temperature was at equilibrium, a DC voltage was applied between the negative electrode (cathode) and the grounded sample (anode) and gradually increased to about −2 kV with a current of 0.3 mA. The distance between the two electrodes was about 1 cm. The pressure was ambient, atmospheric pressure. It was found that the solder was indeed very well wetted on the copper surface. Without applying an electric voltage, a good wetting of a fluxless solder on a copper surface can never be achieved at such low temperature, even in pure $H_2$, because the effective temperature for pure $H_2$ to remove tin-oxides on a tin-based solder is above 350° C. Therefore, this result confirms that the electron-attachment method is effective in promoting $H_2$ fluxless soldering.

EXAMPLE 2

A second experiment was conducted by using the same setup and the same sample as above. Differing from the first run, the 2 kV voltage with 0.3 mA was applied during heating of the sample from room temperature under the gas flow of 5% $H_2$ in $N_2$. The heating rate was similar to that typically used for normal reflow soldering processes. It was found that the solder started to wet on the copper surface at 220° C.

EXAMPLE 3

A third experiment was conducted the same way as the second experiment, except that the soldering part was a fluxless tin-silver preform (m.p. 221° C.) on a grounded copper plate. It was found that at 230° C., the solder started to wet on the copper.

EXAMPLE 4

A fourth experiment was conducted the same way as the first experiment, except that the fluxless tin-lead solder perform (a disc shape with 1 mm height and 2 mm diameter) was set on a grounded quartz plate. When the same electric power was applied at 250° C., it was found that the molten solder changed from the disc shape to a nearly spherical shape, indicating that the surface of the molten solder was indeed oxide-free.

EXAMPLE 5

A fifth example was conducted by using a sensitive optical device (pre-tested current vs. voltage) on a grounded copper plate. The sample was loaded inside the same furnace under a gas flow of 5% H2 in N2 by volume. A −2 kV DC voltage with 0.3 mA current was applied during heating of the sample from room temperature to 250° C. and holding at 250° C. for 5 minutes. The sample was then cooled down to room temperature. After the heating cycle, the device was tested (current vs. voltage) to investigate if there was any damage. It was found that the curve of the current vs. voltage for the tested device did not change from before to after the heating cycle. This result indicates that for the electric field applied, there is no chip damage associated with dielectric breakdown.

The alternative to the present invention is plasma-assisted $H_2$ fluxless soldering, where the plasma is induced at either by a microwave or by a transferred corona discharge. The present invention $H_2$ fluxless soldering method assisted by the electron-attachment under a DC voltage potential is quite different from and superior to the plasma-assisted method. The major differences can be listed as follows:

a) The plasma assisted methods are only used to clean oxides on the base metals to be soldered and a flux is still required in the solder paste for reflow soldering. However, the present invention is designed to remove oxides on both the base metals and the solder alloy. Compared to the base metals, the tin-based solders have a significantly higher oxidation potential and the solder oxides are more difficult to reduce. Therefore, the present invention is designed for a more efficient fluxless soldering process, and fluxes are completely eliminated for reflow soldering.

b) In the plasma assisted processes, the fluxing processes are operated prior to wave or reflow soldering, which fluxing processes are like pretreatment steps. This separation between the fluxing and soldering is compatible with the continued wave soldering line, however, it makes reflow soldering completely discontinuous. In the present invention, the fluxing and reflow soldering are preferably designed as a single step, thus the application of the present invention in production-scale reflow soldering is more feasible. The present invention can also be applied to a wave soldering line by a sequential fluxing and soldering of the component-attached circuit boards, and even an additional fluxing of the molten solder bath to prevent dross formation.

c) In the plasma-assisted method either using a microwave or using a transferred corona as a generator, atomic hydrogen is the active species for reducing metal oxides. However, in the present invention, the negatively charged ionic hydrogen molecule or diatomic is used as the active species for reducing metal oxides. This major difference in active species can produce the following different results:

(i) The atomic hydrogen formed by a combination of the oppositely charged species in a plasma is unstable, which has a tendency to form molecular hydrogen which further reduces the free energy and reaches a stable state, especially at ambient pressure, rather than vacuum. However, the electron attachment in the present invention is an energy release process, which makes the formed active species, the negatively charged ionic hydrogen, relatively stable, and the probability of the electron attachment increases with increasing pressure, which makes operation at ambient pressure more favorable than vacuum. Therefore, the fluxing efficiency of the present invention is higher than the plasma assisted method at ambient pressure for a given $H_2$ concentration.

(ii) For the plasma assisted method, the active species is neutral, which cannot be preferentially adsorbed on the surfaces to be treated. However, for the present invention, the negatively charged ionic hydrogen naturally drifts to the solder and metal surfaces (anode) by the continuous electric field applied, which increases the adsorption of $H_2$ on the surfaces to be treated, and thus reduces the effective $H_2$ concentration necessary for complete fluxing.

(iii) For the plasma assisted method, a high frequency AC voltage is more favorable than a DC voltage, because AC voltage is more efficient in the plasma assisted method breakdown of the gas phase molecules and formation of atomic hydrogen. However, to generate the negatively charged ionic hydrogen in the present invention, a DC voltage is preferred. The reason is that compared with an AC voltage, lower electron energies are obtained by using a DC voltage, and the low-energy electrons have a higher affinity to be attached on a gas molecule having a strong electron negativity.

Further distinguishing the plasma assisted method from the present invention are drawbacks based on the difference in the required power sources for the plasma assisted method in comparison to the present invention.

(i) In contrast to the present invention's DC voltage, the AC voltage used in the transferred corona discharge of the plasma assisted method is completely conductive to the semiconductor devices, which increases the potential of IC or chip damage.

(ii) The effective voltage range for the present invention electron-attachment method is below the breakdown point of the gas discharge used for the microwave-generated plasma and is also below the voltage level used for generating high-energy electrons in the transferred corona discharge. Therefore, for the present invention, the operation is safer, the potential of chip damage is lower, and the energy consumption is lower.

(iii) For the plasma assisted methods, both $H_2$ and $N_2$ are ionized (the ionization energies of $H_2$ and $N_2$ are 15.4 and 15.5 ev, respectively), and the ionized $N_2$ ions have no contribution to generating active species. In contrast, for the present invention, electrons generated from the DC potential can only be attached on $H_2$ molecules, which form the active species; $N_2$ with an electron affinity of zero is not affected, so that energy consumption can be largely reduced for an equivalent result.

In addition, the capital cost for the apparatus of the present invention is significantly lower than the plasma-assisted fluxless soldering.

In summary, the major values of the present invention compared with the plasma assisted methods are: 1) both solder and metal surfaces are treated for oxide removal to completely eliminate organic fluxes, 2) there is compatibility with the continued soldering production line, including both reflow and wave soldering, 3) higher fluxing efficiency is achieved at ambient pressure for a given $H_2$ concentration and power consumption, 4) there is less potential of chip damage, and 5) the present invention results in lower capital cost.

The present invention has been set forth with regard to several preferred or illustrative examples, but the full scope of the present invention should be ascertained by the claims which follow.

What is claimed is:

1. A method of dry fluxing metal surfaces of one or more components to be soldered, comprising the steps of:
   a) providing one or more components to be soldered which are connected to a first electrode as a target assembly;
   b) providing a second electrode adjacent said target assembly;
   c) providing a gas mixture comprising a reducing gas between said first and second electrodes;
   d) providing a direct current (DC) voltage to said first and second electrodes and donating electrons to said reducing gas to form negatively charged ionic reducing gas;
   e) contacting said target assembly with said negatively charged ionic reducing gas and reducing oxides on said target assembly.

2. The method of claim 1 wherein said reducing gas is selected from the group consisting of hydrogen, carbon monoxide and mixtures thereof.

3. The method of claim 2 wherein said reducing gas is hydrogen.

4. The method of claim 1 wherein said dry fluxing is performed as a part of a reflow soldering of said one or more components.

5. The method of claim 1 wherein said dry fluxing is performed as a part of a wave soldering of said one or more components.

6. The method of claim 1 wherein oxides on said one or more components are reduced while solder is wetted to join said components.

7. The method of claim 1 wherein said gas mixture is 0.1 to 100% by volume of hydrogen and potentially an inert gas.

8. The method of claim 1 wherein said gas mixture is 0.5 to 50% by volume of hydrogen and an inert gas.

9. The method of claim 8 wherein said inert gas is selected from the group consisting of nitrogen, helium, argon, krypton and mixtures thereof.

10. The method of claim 1 wherein said target assembly is at a temperature in the range of approximately 0 to 400° C. within a heating chamber.

11. The method of claim 10 wherein said target assembly is at a temperature in the range of approximately 100 to 250° C. within the heating chamber.

12. The method of claim 1 wherein said voltage is in the range of approximately −1 to −50 kV.

13. The method of claim 12 wherein said voltage is in the range of approximately −2 to −30 kV.

14. The method of claim 1 wherein the distance between said target assembly and said second electrode is approximately 1 to 10 cm.

15. The method of claim 14 wherein the distance between said target assembly and said second electrode is approximately 2 to 5 cm.

16. A method of dry fluxing a solder joint of two or more components to be soldered and solder, comprising the steps of:
   a) providing two or more components to be soldered and solder which are positioned on an anode as a target assembly;
   b) providing a cathode adjacent said target assembly;
   c) providing a gas mixture comprising hydrogen and an inert gas between said anode and cathode;
   d) providing a direct current (DC) voltage to said anode and cathode to donate electrons to said hydrogen to form negatively charged ionic hydrogen;
   e) contacting said target assembly with said negatively charged ionic hydrogen and reducing oxides on said components and said solder.

17. A method of dry fluxing and soldering a solder joint of two or more components to be soldered and solder, comprising the steps of:
   a) providing two or more components to be soldered and solder which are positioned on an anode as a target assembly at an elevated temperature of at least 100° C. within a heating chamber;
   b) providing a cathode adjacent said target assembly;
   c) providing a gas mixture comprising hydrogen and an inert gas between said anode and cathode;
   d) providing a direct current (DC) voltage of at least −2 kV to said anode and cathode to donate electrons to said hydrogen to form negatively charged ionic hydrogen;
   e) contacting said target assembly with said negatively charged ionic hydrogen and reducing oxides on said components and said solder;
   f) joining said components with solder.

18. A method of dry fluxing and soldering a solder joint of two or more components to be soldered and solder with electron donated hydrogen, comprising the steps of:
   a) providing two or more components to be soldered and solder which are positioned on an anode as a target assembly at an elevated temperature of at least 100° C. and ambient pressure within a heating chamber;
   b) providing a cathode adjacent said target assembly;
   c) providing a gas mixture comprising hydrogen 0.5 to 50% by volume with the balance nitrogen between said anode and cathode;
   d) providing a direct current (DC) voltage of at least −2 kV to said anode and cathode to donate electrons to said hydrogen to form negatively charged ionic hydrogen;
   e) contacting said two or more components and solder with said negatively charged ionic hydrogen by electrical drift to said anode and reducing oxides on said components and said solder;
   f) joining said components with said solder.

19. The method of claim 1 wherein said dry fluxing is conducted at approximately atmospheric pressure.

20. The method of claim 1 wherein said solder is selected from the group consisting of fluxless tin-silver solder, fluxless tin-lead solder, fluxless tin-silver solder paste, fluxless tin-silver solder performs, fluxless tin-lead solder paste, fluxless tin-lead solder performs, a wave bath of fluxless tin-lead solder, a wave bath of fluxless tin-silver solder and mixtures thereof.

21. A method of dry fluxing metal surfaces of one or more components to be soldered, comprising the steps of:
   a) providing one or more components to be soldered which are connected to a first electrode as a target assembly;
   b) providing a second electrode adjacent said target assembly;
   c) providing a gas mixture comprising a reducing gas between said first and second electrodes;
   d) providing a direct current (DC) voltage to said first and second electrodes
   e) generating electrons from a source and donating said electrons to said reducing gas to form negatively charged ionic reducing gas;
   e) contacting said target assembly with said negatively charged ionic reducing gas and reducing oxides on said target assembly.

22. The method of claim 21 wherein said source is selected from the group consisting of photoemission from a photosensitive cathode, electron beam propagation, radioactive sourcing, avalanche electron propagation and combinations thereof.

23. A method of dry fluxing metal surfaces of one or more components to be soldered, comprising the steps of:
   a) providing one or more components to be soldered which are connected to a first electrode as a target assembly;
   b) providing a second electrode adjacent said target assembly;
   c) providing a gas mixture comprising molecular hydrogen between said first and second electrodes at ambient atmospheric pressure;
   d) providing a direct current (DC) voltage to said first and second electrodes
   e) generating electrons from a source and donating said electrons to said molecular hydrogen to form negatively charged ionic molecular hydrogen;
   e) contacting said target assembly with said negatively charged ionic molecular hydrogen and reducing oxides on said target assembly.

24. A method of dry fluxing a solder joint of two or more components to be soldered and solder, comprising the steps of:
   a) providing two or more components to be soldered and solder which are positioned on an anode as a target assembly;
   b) providing a cathode adjacent said target assembly;
   c) providing a gas mixture comprising molecular hydrogen and an inert gas between said anode and cathode at ambient atmospheric pressure;
   d) providing a direct current (DC) voltage to said anode and cathode to donate electrons to said molecular hydrogen to form negatively charged ionic hydrogen;
   e) contacting said target assembly with said negatively charged ionic molecular hydrogen and reducing oxides on said components and said solder.

* * * * *